(12) United States Patent
Hasegawa

(10) Patent No.: US 12,334,298 B2
(45) Date of Patent: Jun. 17, 2025

(54) CHARGED PARTICLE GUN, CHARGED PARTICLE BEAM SYSTEM, AND LOCK NUT

(71) Applicant: Hitachi High-Tech Corporation, Tokyo (JP)

(72) Inventor: Teruaki Hasegawa, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 470 days.

(21) Appl. No.: 17/913,450

(22) PCT Filed: Apr. 7, 2020

(86) PCT No.: PCT/JP2020/015619
§ 371 (c)(1),
(2) Date: Sep. 22, 2022

(87) PCT Pub. No.: WO2021/205526
PCT Pub. Date: Oct. 14, 2021

(65) Prior Publication Data
US 2023/0126658 A1 Apr. 27, 2023

(51) Int. Cl.
*H01J 37/20* (2006.01)
*H01J 37/295* (2006.01)

(52) U.S. Cl.
CPC .......... *H01J 37/20* (2013.01); *H01J 37/2955* (2013.01); *H01J 2237/2007* (2013.01); *H01J 2237/20207* (2013.01)

(58) Field of Classification Search
CPC .................. H01J 37/20; H01J 37/2955; H01J 2237/2007; H01J 2237/20207; H01J 37/065
See application file for complete search history.

(56) References Cited

U.S. PATENT DOCUMENTS

| 171,898 A | 1/1876 | Wiles |
| 5,629,528 A * | 5/1997 | Jost .................. H01J 37/09 |
| | | 250/492.21 |

(Continued)

FOREIGN PATENT DOCUMENTS

| CN | 108930706 A | 12/2018 |
| CN | 109804192 A | 5/2019 |

(Continued)

OTHER PUBLICATIONS

International Search Report (PCT/ISA/210) issued in PCT Application No. PCT/JP2020/015619 dated Jun. 9, 2020 with English translation (six (6) pages).

(Continued)

*Primary Examiner* — David A Vanore
(74) *Attorney, Agent, or Firm* — Crowell & Moring LLP

(57) ABSTRACT

This charged particle gun has a bolt to which a charged particle source is attached, a nut that is screwed together with the bolt and thereby holds the charged particle source, and a nut seat surface in contact with the nut. The nut includes an inclination adjustment section whereby it is possible to adjust the angle of inclination of the charged particle source with respect to the nut seat surface, and a lock section that inhibits the nut and the bolt from becoming loose when screwed together. The inner surface of the nut has a screw thread section and a non-screw thread section with a larger inner diameter than the screw thread section. The inclination adjustment section has: a first slit formed so as to pass through an area from one part of the outer surface of the nut to one part of the non-screw thread section; an inclination adjustment screw; a first part positioned between the first slit and a second surface; a second part positioned between the first slit and a first surface; and a first screw hole that is screwed together with the inclination adjustment (Continued)

screw and formed so as to pass through an area from the first surface to the first slit in the second part.

17 Claims, 10 Drawing Sheets

(56) References Cited

U.S. PATENT DOCUMENTS

| | | | | |
|---|---|---|---|---|
| 5,662,445 | A * | 9/1997 | Harbottle | F16C 25/06 |
| | | | | 411/290 |
| 6,977,377 | B2 * | 12/2005 | Okubo | H01J 37/1477 |
| | | | | 250/307 |
| 9,570,268 | B2 * | 2/2017 | Imai | H01J 37/08 |
| 10,908,380 | B2 | 2/2021 | Sano et al. | |
| 12,119,202 | B2 * | 10/2024 | Motomura | H01J 37/153 |
| 2005/0006604 | A1 * | 1/2005 | Okubo | H01J 37/1477 |
| | | | | 250/492.23 |
| 2012/0217391 | A1 * | 8/2012 | Shichi | H01J 37/09 |
| | | | | 250/306 |
| 2015/0020502 | A1 * | 1/2015 | Larigaldie | H05H 1/46 |
| | | | | 60/202 |
| 2016/0104597 | A1 * | 4/2016 | Imai | H01J 37/063 |
| | | | | 313/360.1 |
| 2016/0189917 | A1 * | 6/2016 | Vanderberg | H01J 37/1478 |
| | | | | 250/295 |
| 2016/0217969 | A1 * | 7/2016 | Mizuhara | H01J 37/1478 |
| 2019/0178435 | A1 * | 6/2019 | Olsen | F16M 7/00 |
| 2020/0116190 | A1 * | 4/2020 | Yamashita | F16B 39/286 |
| 2023/0126658 | A1 * | 4/2023 | Hasegawa | H01J 37/2955 |
| | | | | 250/440.11 |

FOREIGN PATENT DOCUMENTS

| | | |
|---|---|---|
| DE | 697 00 671 T2 | 6/2000 |
| DE | 10 2018 219 147 A1 | 5/2019 |
| JP | 58-113255 U | 8/1983 |
| JP | 9-329120 A | 12/1997 |
| JP | 2004-327410 A | 11/2004 |
| JP | 2008-251371 A | 10/2008 |
| JP | 2009-281426 A | 12/2009 |
| JP | 2015-509262 A | 3/2015 |
| JP | 2017-228488 A | 12/2017 |
| KR | 2000-0010177 U | 6/2000 |
| KR | 10-2012-0006388 A | 1/2012 |
| TW | 201635326 A | 10/2016 |
| WO | WO 2013/147469 A1 | 10/2013 |

OTHER PUBLICATIONS

Japanese-language Written Opinion (PCT/ISA/237) issued in PCT Application No. PCT/JP2020/015619 dated Jun. 9, 2020 (four (4) pages).

German-language Office Action issued in German Application No. 11 2020 006 608.8 dated Oct. 31, 2024 with English translation (14 pages).

* cited by examiner

CHARGED PARTICLE GUN, CHARGED PARTICLE BEAM SYSTEM, AND LOCK NUT

TECHNICAL FIELD

The present invention relates to a charged particle beam system, and more particularly, to a technique particularly effective when the same is applied to a nut configured to hold a charged particle source.

BACKGROUND ART

In JP-A-2017-228488 (PTL 1), disclosed is a method of adjusting an emission direction of an electron beam in an electron beam emitter apparatus. In JP-A-2009-281426 (PTL 2), disclosed is a lock nut configured to adjust rotational balance of a rotating main shaft of a machine tool.

CITATION LIST

Patent Literature

PTL 1: JP-A-2017-228488
PTL 2: JP-A-2009-281426

SUMMARY OF INVENTION

Technical Problem

A charged particle beam system such as a scanning electron microscope (SEM) detects a charged particle (a secondary electron or the like) obtained by scanning a sample with a charged particle beam such as an electron beam, thereby forming an image. Therefore, an inclination angle of an irradiation axis of the charged particle beam with respect to the sample has a significant influence on performance of the charged particle beam system.

Further, in the case of a structure configured to hold a charged particle source using a nut, for example, when a screw thread section of a nut hole becomes loose due to external force such as vibration of an apparatus, an inclination angle of the charged particle source with respect to a sample is changed.

It is an object of the present invention to provide a technique of optimizing an inclination angle of an irradiation axis of a charged particle beam with respect to a sample.

Solution to Problem

A charged particle gun according to one aspect of the present invention includes a charged particle source, a bolt having the charged particle source attached thereto, a nut including a first surface and a second surface on an opposite side of the first surface and configured to hold the charged particle source by being screwed onto the bolt having the charged particle source attached thereto, and a nut seat surface configured to contact the second surface of the nut. The nut includes the first surface, the second surface, an outer surface, and an inner surface, a screw thread section provided on a portion of the inner surface and formed with a plurality of screw threads to be screwed with the bolt, an inclination adjustment section configured to be able to adjust an inclination angle of the charged particle source with respect to the nut seat surface, the charged particle source being in a state of being held by the nut, and a lock section configured to prevent loosening of a screwed state between the nut and the bolt. The inner surface of the nut includes the screw thread section, and a non-screw thread section having an inner diameter larger than an inner diameter of the screw thread section. The inclination adjustment section includes a first slit formed to be penetrated from a portion of the outer surface to a portion of the non-screw thread section, an inclination adjustment screw, a first portion positioned between the first slit and the second surface, a second portion positioned between the first slit and the first surface, and a first screw hole having the inclination adjustment screw screwed thereinto, the first screw hole being formed to be penetrated from the first surface to the first slit in the second portion. A tip of the inclination adjustment screw presses the nut seat surface via the first portion, thereby changing the inclination angle of the charged particle source with respect to the nut seat surface.

A charged particle beam system according to another aspect of the present invention includes a charged particle gun, an optical processing unit configured to optically process a charged particle beam emitted from the charged particle gun, a sample holding unit configured to hold a sample to be irradiated with the charged particle beam, and a computer system configured to control the optical processing unit. The charged particle gun includes a charged particle source, a bolt having the charged particle source attached thereto, a nut including a first surface and a second surface on an opposite side of the first surface, and configured to hold the charged particle source by being screwed onto the bolt having the charged particle source attached thereto, and a nut seat surface configured to contact the second surface of the nut. The nut includes the first surface, the second surface, an outer surface, and an inner surface, a screw thread section provided on a portion of the inner surface and formed with a plurality of screw threads to be screwed with the bolt, an inclination adjustment section configured to be able to adjust an inclination angle of the charged particle source with respect to the nut seat surface, the charged particle source being in a state of being held by the nut, and a lock section configured to prevent loosening of a screwed state between the nut and the bolt. The inner surface of the nut includes the screw thread section, and a non-screw thread section having an inner diameter larger than an inner diameter of the screw thread section. The inclination adjustment section includes a first slit formed to be penetrated from a portion of the outer surface to a portion of the non-screw thread section, an inclination adjustment screw, a first portion positioned between the first slit and the second surface, a second portion positioned between the first slit and the first surface, and a first screw hole having the inclination adjustment screw screwed thereinto, the first screw hole being formed to be penetrated from the first surface to the first slit in the second portion. A tip of the inclination adjustment screw presses the nut seat surface via the first portion, thereby changing the inclination angle of the charged particle source with respect to the nut seat surface.

A lock nut according to still another aspect of the present invention includes a first surface, a second surface on an opposite side of the first surface, a nut hole penetrated from one side of the first surface and the second surface to the other side thereof, an inner surface which is an outer edge of the nut hole, an outer surface on an opposite side of the inner surface, a screw thread section provided on a portion of the inner surface and formed with a plurality of screw threads, an inclination adjustment section configured to be able to adjust an inclination angle of the nut hole with respect to a nut seat surface facing the second surface, and a lock section configured to prevent loosening of a screwed state of a bolt screwed into the nut hole. The inner surface includes the screw thread section, and a non-screw thread section having an inner diameter larger than an inner diameter of the screw thread section. The inclination adjustment section includes a first slit formed to be penetrated from a portion of the outer surface to a portion of the non-screw thread section, an inclination adjustment screw, a first portion positioned between the first slit and the second surface, a second portion positioned between the first slit and the first surface, and a first screw hole having the inclination adjustment screw screwed thereinto, the first screw hole being formed to be penetrated from the first surface to the first slit in the second portion. A tip of the inclination adjustment screw presses the nut seat surface via the first portion, thereby changing an inclination angle of a nut axis with respect to the nut seat surface.

Advantageous Effects of Invention

According to aspects of the present invention, it is possible to optimize an inclination angle of an irradiation axis of a charged particle beam with respect to a sample.

DESCRIPTION OF EMBODIMENTS

Figure 1:
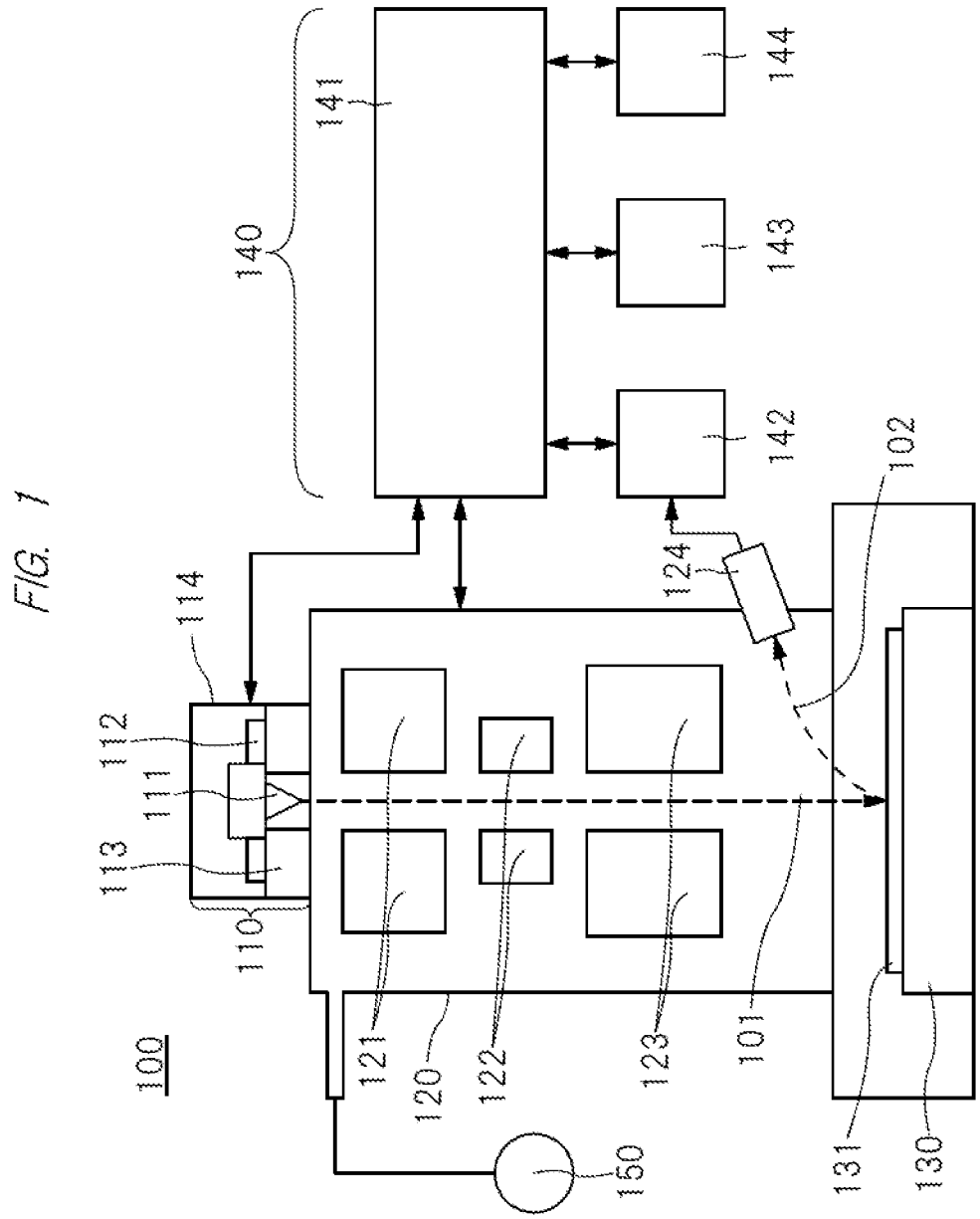
FIG. 1 is an explanatory view showing a configuration example of a scanning electron microscope which is an example of a charged particle beam system according to an embodiment.

Hereinafter, respective embodiments of the present invention will be described with reference to the drawings. The disclosure is merely exemplary, and those skilled in the art can appropriately modify each of the above embodiments, and such modifications are also encompassed within the scope of the invention as long as the modifications fall within the spirit of the invention. Further, in order to more clarify the illustration, the drawings may schematically illustrate widths, thicknesses, and shapes of the respective parts as compared with actual configurations, but those illustrations are merely exemplary and do not limit the interpretation of the present invention. In addition, in the present specification and the respective drawings, the same elements as those already described in the drawings are denoted by the same or related reference numerals, and a detailed description thereof will be appropriately omitted.

Further, the description of the following embodiments shows, as a charged particle beam system, an example in which the present disclosure is applied to a scanning electron microscope (SEM) using an electron beam. However, this embodiment should not be construed as limitation of the present disclosure. For example, the present disclosure can be applied to a system using a charged particle beam such as an ion beam and also to a general observation system.

Additionally, in the embodiments described below, a pattern measurement device configured to measure a pattern on a sample (a semiconductor wafer) will be described as an example of a scanning electron microscope. Here, the "scanning electron microscope" broadly includes a device configured to capture an image of a sample using an electron beam. Other examples of the scanning electron microscope include an inspection device using a scanning electron microscope, a review device, a general-purpose scanning electron microscope, a sample processing device and a sample analysis device provided with a scanning electron microscope, and the like, and the present disclosure is also applicable to these devices. Further, in the embodiments described below, a scanning electron microscope also includes a system in which the scanning electron microscope is connected by a network and a composite device configured to combine the plurality of scanning electron microscopes.

Further, in the embodiments described below, the term "sample" is described as an example of a semiconductor wafer on which a pattern is formed, but is not limited thereto. The sample may be a substrate for a display device and a magnetic device, metal, ceramics, a biological sample, and the like.

First Embodiment

<Configuration of Charged Particle Beam System>

First, a configuration example of a charged particle beam system will be described with reference to FIG. 1. In the following description, as a representative example of the charged particle beam system, a scanning electron microscope will be described. FIG. 1 is an explanatory view showing a configuration example of the scanning electron microscope which is an example of the charged particle beam system of the embodiment.

A scanning electron microscope 100 shown in FIG. 1 includes a charged particle gun 110 configured to emit a charged particle beam, an optical processing unit 120 configured to optically process a charged particle beam 101 emitted from the charged particle gun 110, a sample holding unit 130 configured to hold a sample 131 irradiated with the charged particle beam, and a computer system 140 configured to control the optical processing by the optical processing unit 120.

The scanning electron microscope 100 detects a charged particle (for example, a secondary electron 102 and a backscattered electron) obtained by scanning the sample 131 (the semiconductor wafer) held in the sample holding unit 130 with the charged particle beam 101. Further, the scanning electron microscope 100 generates, for example, an image signal with an image processing unit 142 of the computer system 140 based on a detection result of the charged particle, and outputs the generated image signal to a display device 143.

As shown in FIG. 1, the charged particle gun 110 includes a charged particle source 111, a nut 112 configured to hold the charged particle source 111, and a nut seat 113 configured to support the nut 112. The optical processing unit 120 includes a focusing lens 121, a deflector 122, an objective lens 123, and a secondary electron detector (a detection unit) 124.

The computer system 140 includes a computer 141 configured to control the operation of the charged particle gun 110, the operation of the optical processing unit 120, and the processing of the detected signal. Further, the computer system 140 also includes the image processing unit 142 configured to perform image processing on the signal detected by the secondary electron detector 124 and to output the same as an image signal. Additionally, the computer system 140 also includes the display device 143 configured to display the image signal generated by the image processing unit as an image. The computer system 140 also includes an input unit 144 such as a keyboard and mouse with which a command signal and a data signal are input to the computer 141.

An observation method of the sample 131 using the scanning electron microscope 100 is performed as follows. First, the sample 131 is placed on the sample holding unit 130. The sample holding unit 130 is a movable stage configured to be able to move in the horizontal direction, and can cause any position of the sample 131 to be observed by horizontally moving the sample 131 while holding the sample 131 on the stage.

For example, when a pattern of an integrated circuit formed on a semiconductor device as the sample 131 is observed and inspected, a program called a recipe is generated in advance, the program being configured to store operation conditions or the like of the charged particle gun 110, the optical processing unit 120, and the computer system 140. This recipe is input to the computer 141 via the input unit 144.

When the observation processing of the sample 131 is started, the charged particle beam 101 is formed in the charged particle source 111 of the charged particle gun 110 based on a drive signal output from the computer 141 of the computer system 140, and is emitted toward the sample 131. Further, the optical processing unit 120 is an airtight space and is connected to an exhaust pump 150. The exhaust pump 150 is operated before the observation processing of the sample 131 is started, and the space inside the optical processing unit 120 is maintained in a decompressed state. Therefore, it is possible to prevent the charged particle beam 101 and other particles from colliding with each other until the charged particle beam 101 formed by the charged particle source 111 reaches the surface of the sample 131.

The charged particle beam 101 emitted from the charged particle source 111 is focused by the focusing lens 121. Next, the charged particle beam 101 is scanned and deflected by the deflector 122. Then, the charged particle beam 101 is focused on the surface of the sample 131 by the objective lens 123. The secondary electron 102 and a backscattered ray (not shown) are emitted from the sample 131, and these charged particles are detected by the detection unit. In FIG. 1, as an example of a detection unit configured to detect a charged particle emitted from the sample 131, the secondary electron detector 124 configured to detect the secondary electron 102 is shown. However, there are various modifications of the charged particle detected by the detection unit. For example, when a backscattered electron is detected as a charged particle, a backscattered electron detector, which is not shown, may be provided as a detection unit.

The scanning electron microscope 100 two-dimensionally scans the position at which the charged particle beam 101 is focused on the surface of the sample 131. The horizontal movement of the sample holding unit 130 and the deflection by the deflector 122 are used to two-dimensionally scan any position of the sample 131. When such two-dimensional scanning is performed a plurality of times, it is possible to convert data of the charged particle such as the detected secondary electron 102 into image data. The image processing unit 142 generates image data based on the data of the charged particle such as the secondary electron 102 and the data of the two-dimensional scanning. The image data generated by the image processing unit 142 is output to the display device 143 via the computer 141. An operator can observe the state of the sample 131 with an image displayed on the display device 143.

The charged particle beam system including the scanning electron microscope 100 shown in FIG. 1 requires high magnification and high measurement reproducibility. In recent years, with the progress of miniaturization of an object to be inspected of the sample 131 and high integration thereof, the charged particle beam system is required to be able to perform measurement over a wider range and to perform highly accurate measurement at each measurement point.

Thus, when the measurement accuracy by the charged particle beam system is improved, an inclination angle of an irradiation axis of the charged particle beam 101 emitted from the charged particle source 111 with respect to the sample 131 has a significant influence on the measurement accuracy of the charged particle beam system. For example, when the charged particle source 111 is mounted in the charged particle gun 110, measurement performance may deteriorate depending on a mounting angle of the charged particle source 111 even if the scanning electron microscope 100 is operated with the same recipe. Further, when the charged particle source 111 held in the charged particle gun 110 is moved due to external force such as vibration and impact, the movement thereof causes a trouble in measurement.

Therefore, the charged particle beam system including the scanning electron microscope 100 shown in FIG. 1 preferably has a function of adjusting the inclination angle of the irradiation axis of the charged particle beam 101 emitted from the charged particle source 111 with respect to the sample 131. Additionally, the charged particle beam system including the scanning electron microscope 100 preferably has a function of preventing the inclination angle from changing after the inclination angle is adjusted. Hereinafter, the function of the charged particle gun 110 provided in the scanning electron microscope 100 will be described in detail.

<Charged Particle Gun>

Figure 2:
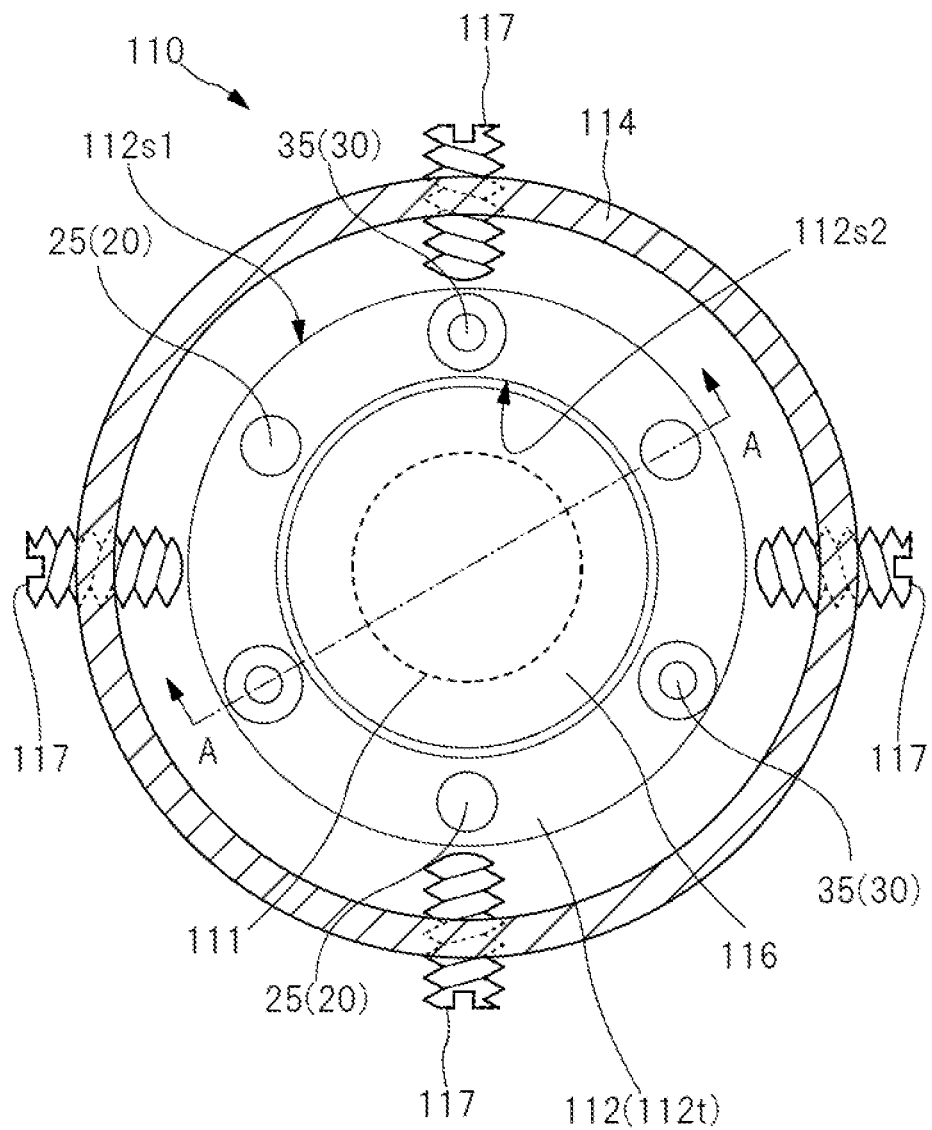
FIG. 2 is a plan view showing a positional relationship between a nut and a charged particle source accommodated in an adjustment ring base of a charged particle gun shown in FIG. 1.
Figure 3:
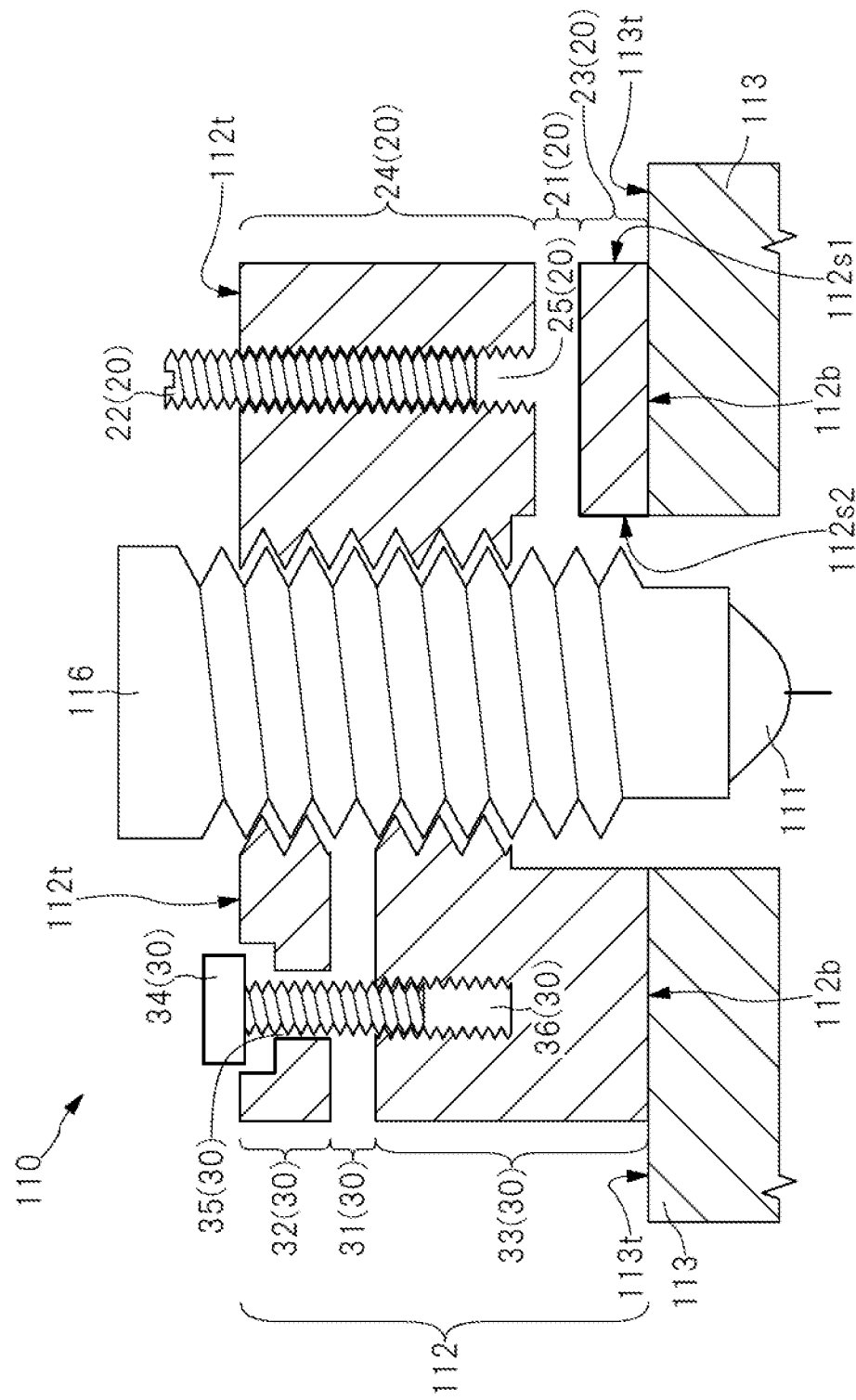
FIG. 3 is a cross-sectional view of the nut taken along line A-A in FIG. 2.
Figure 4:
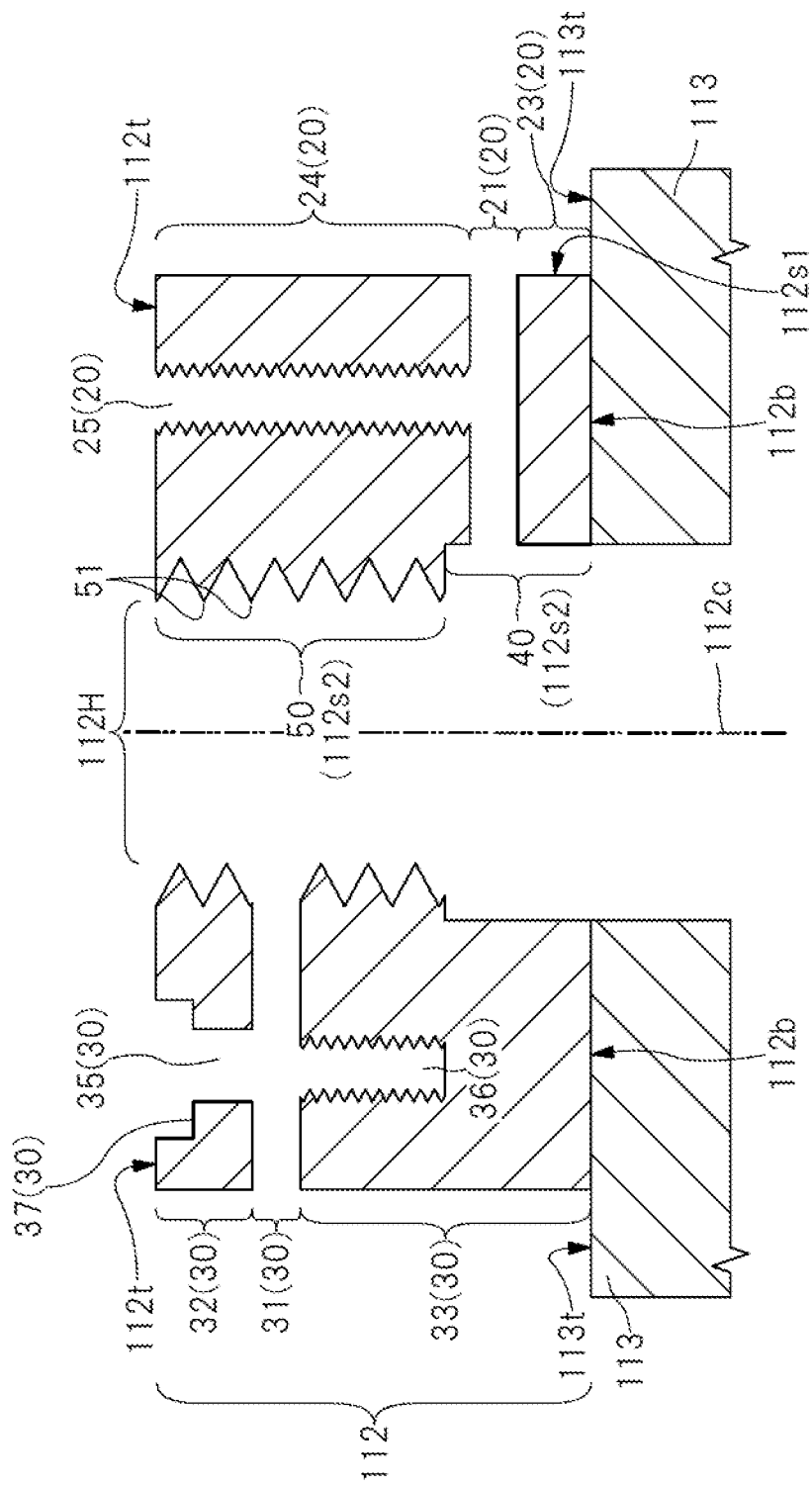
FIG. 4 is a cross-sectional view showing the state in which an inclination screw, a lock screw, a bolt, and the charged particle source shown in FIG. 3 are removed.

FIG. 2 is a plan view showing a positional relationship between a nut and a charged particle source accommodated in an adjustment ring base of the charged particle gun shown in FIG. 1. Although FIG. 2 is a plan view, in order to show a positional relationship between an adjustment ring base 114, the nut 112, and the charged particle source 111, the adjustment ring base 114 shows a cross-section thereof cut in the horizontal direction, and the charged particle source 111 is shown by a dotted line. FIG. 3 is a cross-sectional view of the nut taken along line A-A in FIG. 2. However, in FIG. 3, each of a bolt 116, the charged particle source 111, an inclination adjustment screw 22, and a lock screw 34 is shown as a side view. FIG. 4 is a cross-sectional view showing the state in which an inclination screw, the lock screw, the bolt, and the charged particle source shown in FIG. 3 are removed.

As shown in FIG. 2, the charged particle gun 110 of the embodiment includes the charged particle source 111, the bolt 116 having the charged particle source 111 attached thereto, the nut 112, and a nut seat surface 113*t* (refer to FIG. 3). The nut 112 has an upper surface 112*t* and a lower surface 112*b* on the opposite side of the upper surface 112*t* (refer to FIG. 3). The nut 112 holds the charged particle source 111 by being screwed onto the bolt 116 having the charged particle source 111 attached thereto. As shown in FIG. 3, the nut seat 113 has the nut seat surface 113*t* facing the lower surface 112*b* of the nut 112.

Further, the nut 112 includes the upper surface 112*t*, the lower surface 112*b*, an outer surface 112*s*1, an inner surface 112*s*2, and a screw thread section 50 (refer to FIG. 4) provided on a portion of the inner surface 112*s*2 and formed with a plurality of screw threads 51 (refer to FIG. 4) to be screwed with the bolt 116. The nut 112 also includes, as shown in FIG. 3, an inclination adjustment section 20 configured to be able to adjust an inclination angle of the charged particle source 111 held by the nut 112 with respect to the nut seat surface 113*t*, and a lock section 30 configured to prevent loosening of the screwed state between the nut 112 and the bolt 116.

As shown in FIG. 4, the inner surface 112*s*2 of the nut 112 includes the screw thread section 50, and a non-screw thread section 40 (refer to FIG. 4) having an inner diameter larger than that of the screw thread section 50. As shown in FIG. 3, the inclination adjustment section 20 includes a slit 21 formed to be penetrated from a portion of the outer surface 112*s*1 to a portion of the non-screw thread section 40 (refer to FIG. 4), the inclination adjustment screw 22, a portion 23 located between the slit 21 and the lower surface 112*b*, a portion 24 located between the slit 21 and the upper surface 112*t*, and a screw hole 25 into which the inclination adjustment screw 22 is screwed, the screw hole 25 being formed to be penetrated from the upper surface 112*t* to the slit 21 in the portion 24.

In the example shown in FIG. 4, a plurality of screw threads 51 are not formed in the non-screw thread section 40. Further, each of the screw thread section 50 and the non-screw thread section 40 forms a nut hole 112H of the nut 112. In the following description, a center line (a virtual line) of the nut hole 112H will be referred to as a nut axis 112*c*. The nut axis 112*c* of the screw thread section 50 in the nut hole 112H coincides with the irradiation axis of the charged particle beam 101 shown in FIG. 1. Therefore, when the inclination angle of the nut axis 112*c* of the screw thread section 50 shown in FIG. 4 is changed, it is possible to change the inclination angle of the irradiation axis of the charged particle beam 101 shown in FIG. 1.

Figure 6:
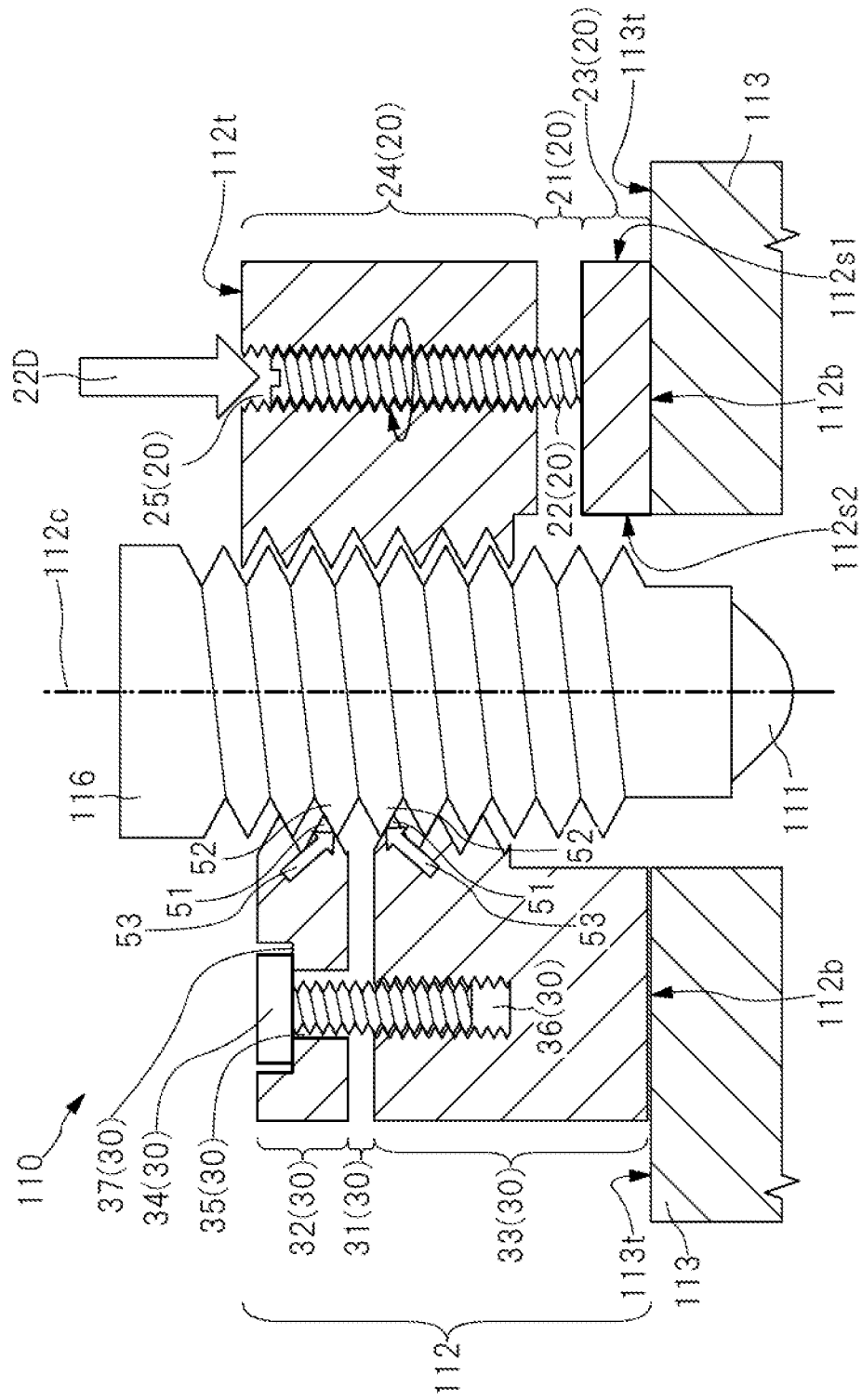
FIG. 6 is a cross-sectional view showing the state in which an inclination adjustment screw shown in FIG. 5 is in contact with a lower portion of a slit.

As shown in FIG. 6 to be described later, in the case of the nut 112 of the embodiment, the tip of the inclination adjustment screw 22 presses the nut seat surface 113*t* through the portion 23, thereby changing the inclination angle of the charged particle source 111 with respect to the nut seat surface 113*t*. In this manner, by including the lock section 30 and the inclination adjustment section configured to be able to adjust the inclination angle of the charged particle source 111 with respect to the nut seat surface 113*t*, it is possible to optimize the inclination angle of the irradiation axis of the charged particle beam 101 shown in FIG. 1 with respect to the sample 131. That is, as shown in FIG. 1, in the case of the scanning electron microscope 100 including the charged particle gun 110, since the nut 112 includes the inclination adjustment section 20 (refer to FIG. 3), it is possible to adjust the inclination angle of the irradiation axis of the charged particle beam 101 with respect to the sample 131. Further, since the nut 112 includes the lock section 30, the lock section 30 can prevent the loosening of the screwed state between the nut 112 and the bolt 116 (refer to FIG. 3). In this manner, the inclination angle of the charged particle source 111 with respect to the nut seat surface 113*t* shown in FIG. 3 is adjusted in the state in which the bolt 116 is locked to the nut 112, thereby making it possible to improve adjustment accuracy of the inclination angle thereof. Further, the inclination angle of the charged particle source 111 with respect to the nut seat surface 113*t* shown in FIG. 3 is adjusted in the state in which the bolt 116 is locked to the nut 112, thereby making it possible to prevent the inclination angle from changing after the adjustment.

Figure 5:
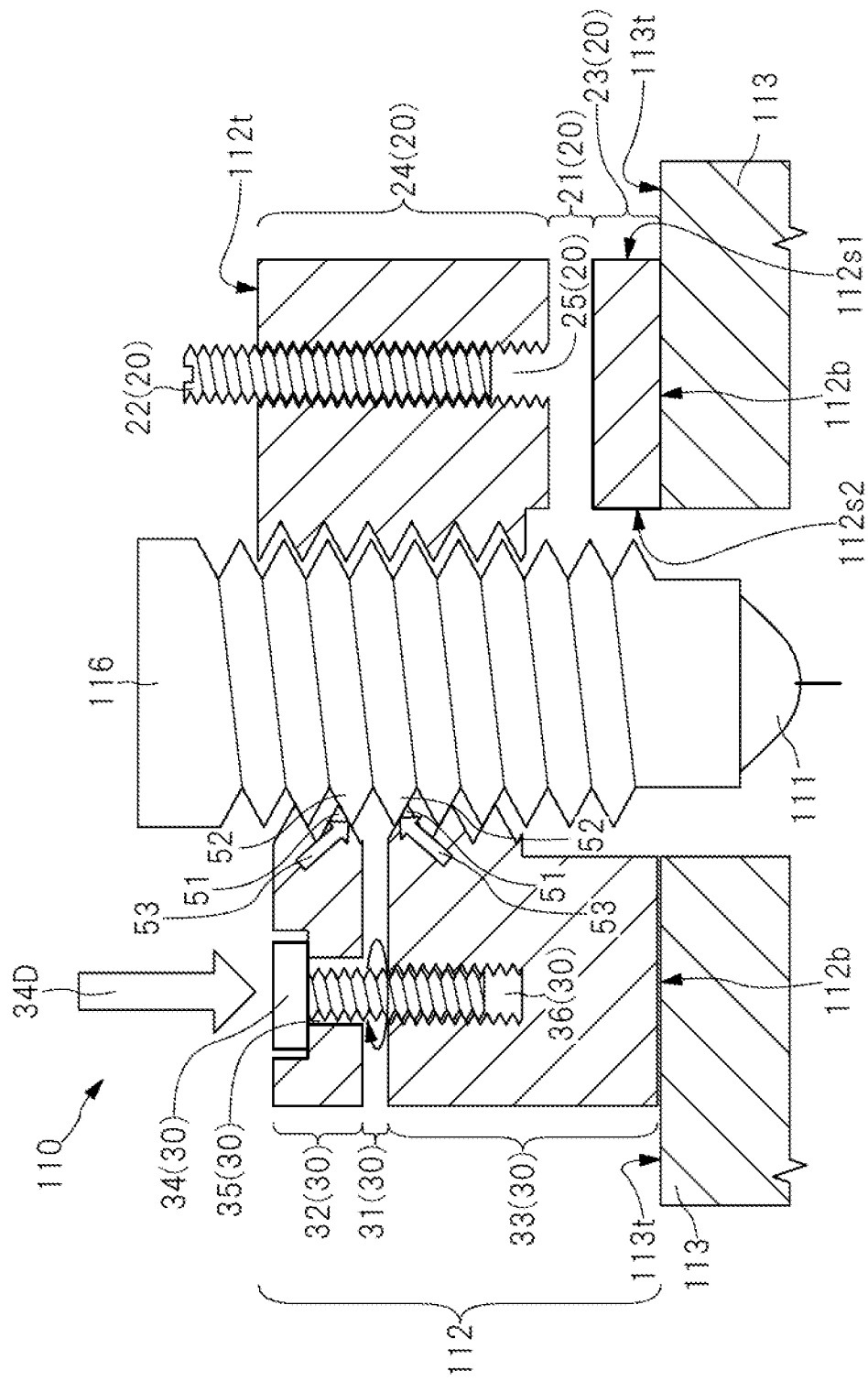
FIG. 5 is a cross-sectional view showing the state in which the lock screw shown in FIG. 3 is tightened.

In addition, the lock section 30 can be applied in various aspects as long as the same can prevent the loosening of the screwed state between the nut 112 and the bolt 116 (refer to FIG. 3). In the example shown in FIG. 3, the lock section 30 includes a slit 31 formed to be penetrated from a portion of the outer surface 112*s*1 to a portion of the screw thread section 50 (refer to FIG. 4), a portion 32 located between the slit 31 and the upper surface 112*t*, and a portion 33 located between the slit 31 and the lower surface 112*b*. Further, the lock section 30 includes the lock screw 34, a through hole 35 having the lock screw 34 inserted thereinto, the through hole 35 being formed to be penetrated from the side of the upper surface 112*t* to the slit 31 in the portion 32, and a screw hole 36 having the lock screw 34 screwed thereinto, the screw hole 36 being formed from the side of the slit 31 toward the lower surface 112*b* in the portion 33. As shown in FIG. 5 to be described later, in the case of the nut 112 of the embodiment, when the lock screw 34 is tightened to reduce a gap of the slit 31, a sloped surface of each screw thread 51 of the portion 32 and the portion 33 presses a sloped surface of a screw thread 52 of the bolt 116.

<Operation of Lock Section>

Next, the operation of the lock section 30 shown in FIG. 3 will be described. FIG. 5 is a cross-sectional view showing the state in which the lock screw shown in FIG. 3 is tightened.

As shown in FIG. 5, when the inclination angle of the charged particle source 111 is adjusted, first, it is preferable to improve the screwing strength between the nut 112 and the bolt 116 by the lock section 30. When the lock screw 34 is rotated in the direction of tightening the same, the lock screw 34 is inserted in the direction indicated by an arrow 34D. In this case, although the screw hole 36 is formed in the portion 33 of the lock section 30, the screw hole is not formed in the portion 32. Therefore, when the lock screw 34 is further tightened after a head part of the lock screw 34 and the portion 32 of the nut 112 come into contact with each other, the gap of the slit 31 is reduced. Thus, when the gap of the slit 31 is reduced by the lock screw 34, the sloped surface of the screw thread 51 of the portion 32 approaches the sloped surface of the screw thread 52 of the bolt 116. Finally, as indicated by the arrows, the sloped surface of each screw thread 51 of the portion 32 and the portion 33 presses the sloped surface of the screw thread 52 of the bolt 116, thereby generating pressing force 53. Accordingly, the bolt 116 is locked to the nut 112. In this case, even if external force such as vibration and impact is applied to the charged particle gun 110, it is possible to prevent loosening of the screwed state between the bolt 116 and the nut 112 due to the external force.

In addition, when the bolt 116 is locked to the nut 112 in the manner shown in FIG. 5, the lock screw 34 is inserted in the thickness direction of the nut 112, in other words, in the direction from the upper surface 112t of the nut 112 toward the lower surface 112b thereof. The structure of the lock section 30 of the embodiment is preferable in the following points.

As shown in FIG. 2, four nut position adjustment screws 117 are inserted into the adjustment ring base 114. The position of the nut 112 in a plan view is adjusted by the nut position adjustment screw 117. Additionally, the volume of the space between the adjustment ring base 114 and the nut 112 is narrow. In this case, it is difficult to insert the lock screw 34 and a tool from the side of the outer surface 112s1 of the nut 112. On the other hand, as shown in FIG. 3, in the case of the nut 112, since the lock screw 34 is inserted from the side of the upper surface 112t of the nut 112, it is possible to easily adjust a degree of locking between the bolt 116 and the nut 112 by the lock section 30.

<Operation of Inclination Adjustment Section>

Figure 7:
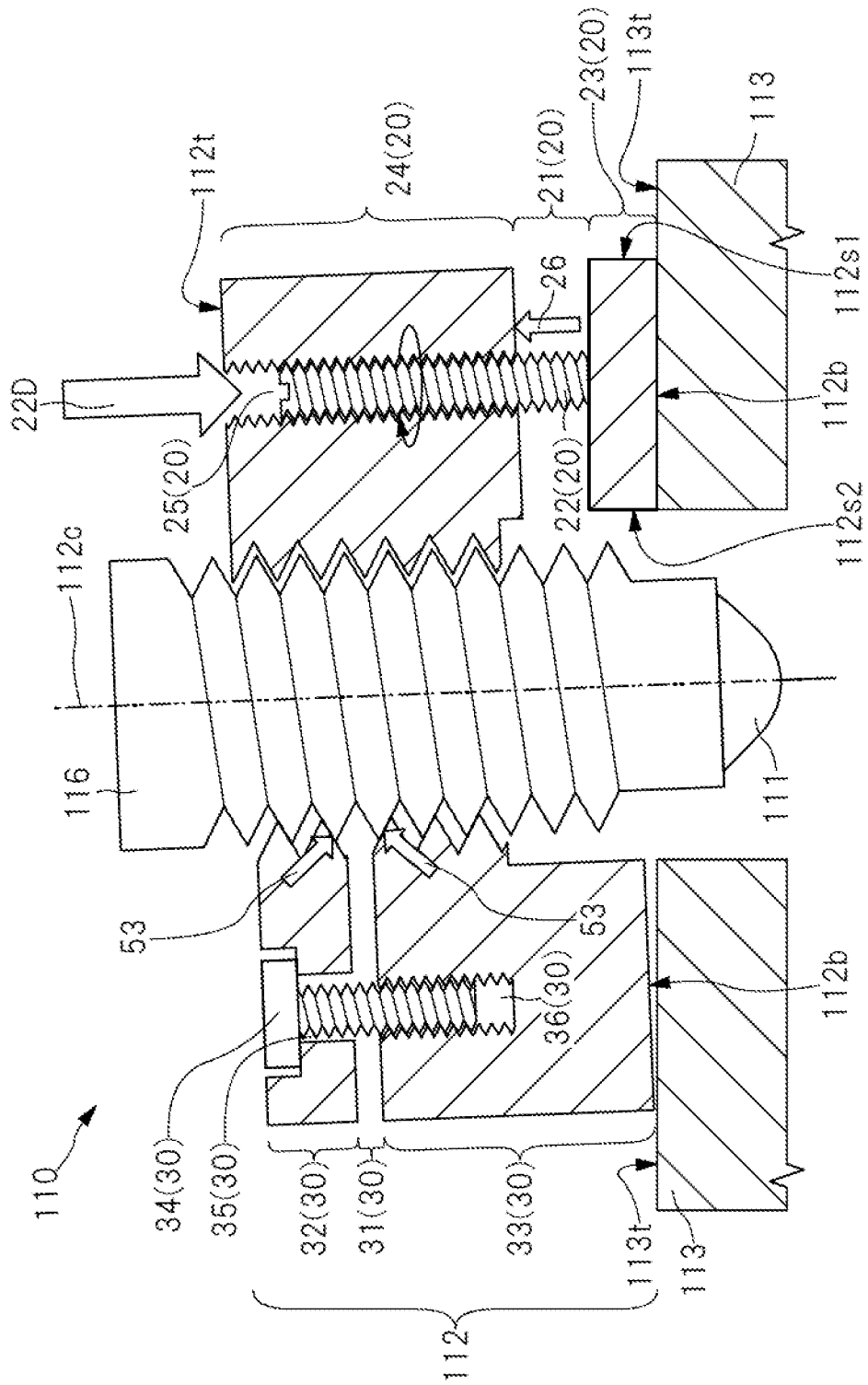
FIG. 7 is cross-sectional view showing the state in which the inclination adjustment screw shown in FIG. 6 is further tightened and a nut seat surface is pressed via the lower portion of the slit.

Next, the operation of the inclination adjustment section 20 shown in FIG. 5 will be described. FIG. 6 is a cross-sectional view showing the state in which the inclination adjustment screw shown in FIG. 5 is in contact with the lower portion of the slit. FIG. 7 is cross-sectional view showing the state in which the inclination adjustment screw shown in FIG. 6 is further tightened and the nut seat surface is pressed via the lower portion of the slit.

As shown in FIG. 6, the inclination adjustment screw 22 is a so-called rod screw without a head part. Therefore, when the inclination adjustment screw 22 is rotated in the direction of tightening the same, as indicated by an arrow 22D, the inclination adjustment screw 22 is advanced downwards in the portion 24. Thereafter, the tip of the inclination adjustment screw 22 protrudes from the lower surface of the portion 24, and contacts the upper surface of the portion 23. When the inclination adjustment screw 22 is further rotated in the direction of tightening the same in this state, as shown in FIG. 7, the length of the portion of the inclination adjustment screw 22 protruding from the portion 24 becomes longer. The screw hole 25 is not formed in the portion 23. Therefore, the inclination adjustment screw 22 presses the portion 23 downwards. Further, the lower surface of the portion 23 (that is, the lower surface 112b of the nut 112) is supported by the nut seat surface 113t of the nut seat 113. Therefore, when the portion 23 is elastically deformed by being pressed by the inclination adjustment screw 22, the position of the portion 23 is hardly changed. Conversely, force 26 indicated by an arrow in FIG. 7 acts on the portion 24. The action of the force 26 causes the portion 24 to be pushed upwards. As a result, as shown in FIG. 7, the nut axis 112c of the screw thread section 50 (refer to FIG. 4) is inclined at an angle that is not perpendicular to the nut seat surface 113t of the nut seat 113.

Further, in this case, the lock screw 34 of the lock section 30 is in the state in which the same is tightened into the screw hole 36. Therefore, as shown in FIG. 7, the pressing force 53 continuously acts, thereby making it possible to prevent the loosening of the screwed state between the bolt 116 and the nut 112 when the inclination angle is changed. Thus, in the case of the nut 112, the inclination angle of the nut axis 112c with respect to the nut seat surface 113t is adjusted, thereby making it possible to adjust the inclination angle of the irradiation axis of the charged particle beam 101 shown in FIG. 1 with respect to the sample 131.

Figure 8:
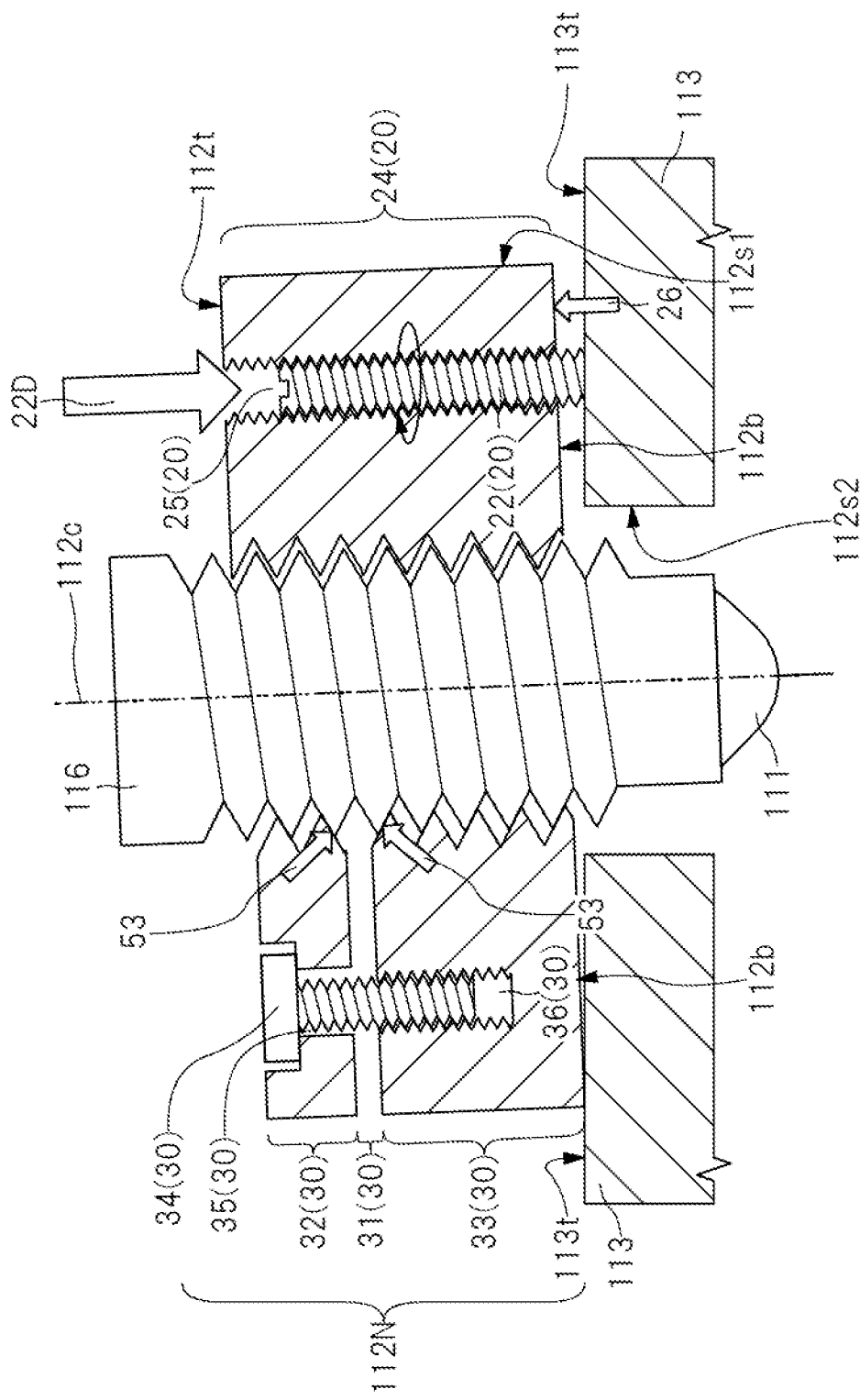
FIG. 8 is a cross-sectional view showing a study example for the nut shown in FIG. 7.

Meanwhile, with respect to the structure of the inclination adjustment section 20, the present inventor has studied the structure of a nut 112N shown in FIG. 8. FIG. 8 is a cross-sectional view showing a study example for the nut shown in FIG. 7. The nut 112N shown in FIG. 8 is different from the nut 112 shown in FIG. 7 in that the nut 112N does not include the slit 21 and the portion 23 shown in FIG. 7.

Since the nut 112N does not include the slit 21 and the portion 23 shown in FIG. 7, the tip of the inclination adjustment screw 22 directly presses the nut seat surface 113t, as shown in FIG. 8. In this case as well, the force 26 of pushing the inclination adjustment section 20 of the nut 112 upwards acts. However, since a portion of the nut seat 113 formed separately from the nut 112 is locally pressed, a portion of the nut seat surface 113t is scraped and the surface thereof is roughened in the process of adjusting the horizontal position of the charged particle source 11 by sliding the nut 112 on the nut seat 113. Further, the tip surfaces of the inclination adjustment screw 22 are on the same plane only when the tip surfaces thereof are not inclined. On the other hand, when the tip surfaces thereof are inclined, an independent surface is formed for each inclination adjustment screw 22. In this case, the surface in contact with the nut seat surface 113t is not uniform, and the load acting thereon also becomes uneven. However, it is not preferable that adjustment force (frictional force of the seat surface) be changed depending on the roughness of the seat surface and the contact state of the tip of the inclination adjustment screw 22.

On the other hand, in the case of the nut 112 shown in FIG. 7, the tip of the inclination adjustment screw 22 presses the portion 23 of the nut 112 formed to be integrated with the portion 24. Therefore, when the force 26 acts, the contact state with the nut seat 113 is hardly changed even when the gap of the slit 21 is widened by elastic deformation of the portion 23. Further, in the case of the nut 112, the nut axis 112c is inclined due to elastic deformation in the vicinity of the slit 21. Accordingly, when the inclination adjustment screw 22 is rotated in the direction of loosening the same, it is possible to easily return to the original shape shown in FIG. 6. Further, the nut seat surface 113t of the nut seat 113 is pressed by the inclination adjustment screw 22 via the portion 23, but the nut seat surface 113t is in contact with the lower surface 112b of the nut 112 and is not in contact with the inclination adjustment screw 22. Therefore, the stress transmitted through the inclination adjustment screw 22 is dispersed in a wide range.

<Detailed Structure of Nut>

Figure 9:
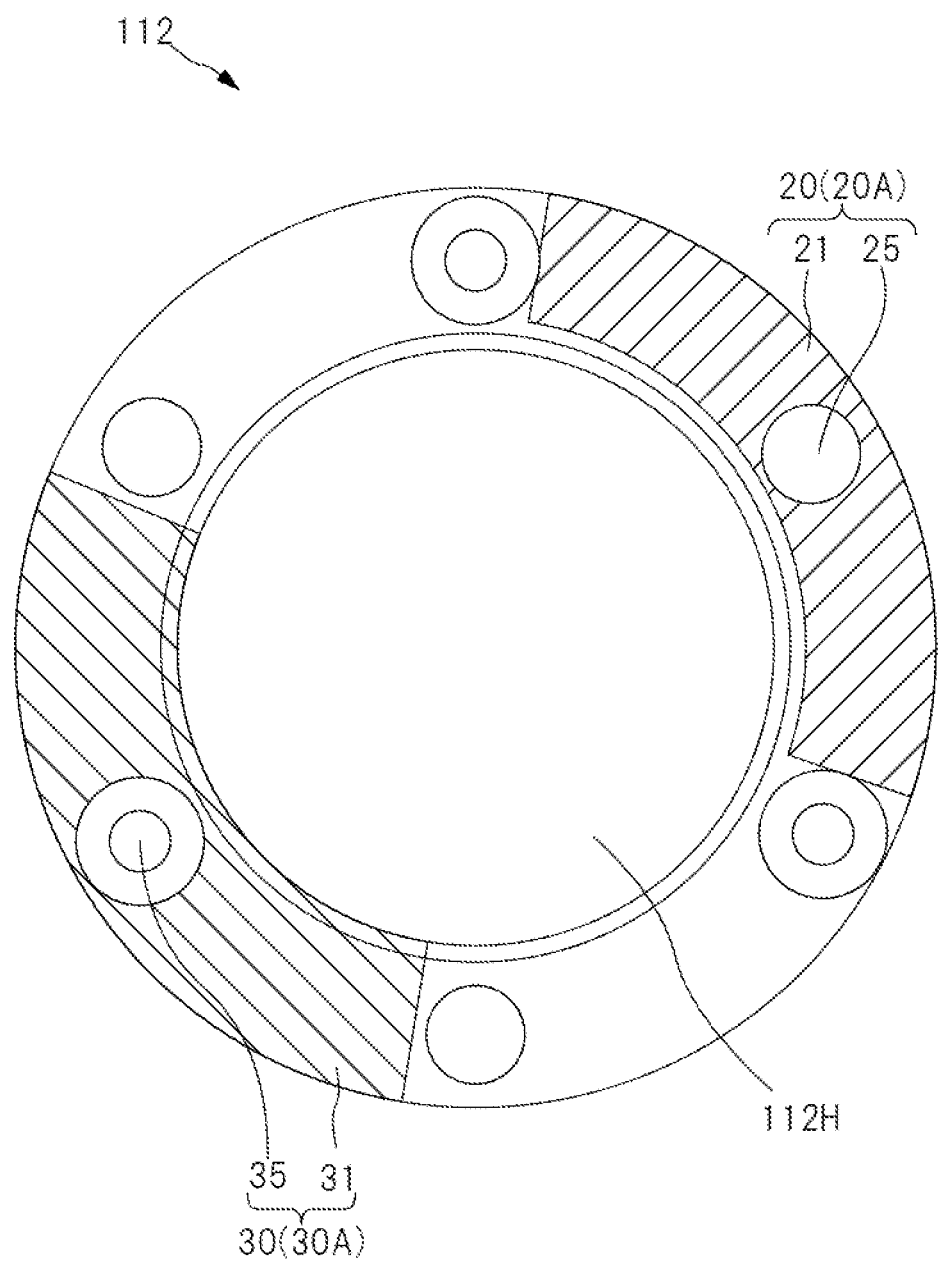
FIG. 9 is a plan view showing the range in which a slit of a lock section and a slit of an inclination adjustment section shown in FIG. 3 are disposed in the nut shown in FIG. 2.

Next, a preferred structure of the nut 112 shown in FIGS. 1 to 7 will be described. FIG. 9 is a plan view showing the range in which the slit of the lock section and the slit of the inclination adjustment section shown in FIG. 3 are disposed in the nut shown in FIG. 2. Although FIG. 9 is a plan view, the slits 21 and 31 are hatched in order to specify the area of the slits 21 and 31. Further, in FIG. 9, the slits 21 and 31 other than the lock section 30 and the inclination adjustment section 20 shown in FIG. 3 are not shown.

From the viewpoint of increasing the amount of deformation of the nut 112 within the elastic deformation range by the force 26 generated by tightening the inclination adjustment screw 22 shown in FIG. 7, it is preferable that, in a plan view, the slit 21 be formed in a wide range and the screw hole 25 be formed near the center of the slit 21 for effective deformation, as shown in FIG. 9. Similarly, from the viewpoint of facilitating the elastic deformation of the portion 32 of the nut 112 by tightening the lock screw 34 shown in FIG. 5, it is preferable that, in a plan view, the slit 31 be formed in a wide range and the through hole 35 be formed near the center of the slit 31, as shown in FIG. 9. In this case, depending on the sizes of the slits 21 and 31, the slit 21 and the slit 31 may overlap each other in a plan view.

In the case of the nut 112 of the embodiment, as shown in FIG. 9, the lock section 30 and the inclination adjustment section 20 does not overlap each other in a plan view. The lock screw 34 of the lock section 30 and the inclination adjustment screw 22 of the inclination adjustment section 20 are disposed so as not to overlap each other, thereby making it possible to prevent the operation of the lock section 30 and the operation of the inclination adjustment section 20 from interfering with each other.

Further, as shown in FIG. 6, the thickness of the portion 24 of the inclination adjustment section 20 (the distance from the upper surface 112*t* to the slit 21) is larger than the thickness of the portion 23 (the distance from the slit 21 to the lower surface 112*b*). In other words, the slit 21 is disposed closer to the side of the lower surface 112*b* of the nut 112 than the center of the nut 112 in the thickness direction of the nut 112. Bending strength of the portion 24 increases in proportion to the thickness of the portion 24. From the viewpoint of preventing the portion 24 from being deformed at an unintended location and preventing a screw function of the screw thread 51 from being impaired due to the force 26 shown in FIG. 7, it is preferable that the thickness of the portion 24 be large. Further, when the thickness of the portion 23 is increased, the thickness of the non-screw thread section 40 shown in FIG. 4 is increased. Therefore, when the thickness of the nut 112 is constant, the larger the thickness of the non-screw thread section 40 is, the smaller the thickness of the screw thread section 50 is. In order to improve the screwing strength between the bolt 116 and the nut 112 shown in FIG. 6, it is preferable to increase the thickness of the screw thread section 50. However, although not shown herein, as a modification of the embodiment, the thickness of the portion 24 of the inclination adjustment section 20 may be smaller than the thickness of the portion 23.

Further, the thickness of the portion 32 of the lock section 30 (the distance from the upper surface 112*t* to the slit 31) is smaller than the thickness of the portion 33 (the distance from the slit 31 to the lower surface 112*b*). In other words, the slit 31 is disposed closer to the side of the upper surface 112*t* of the nut 112 than the center of the nut 112 in the thickness direction of the nut 112. The screw hole 36 screwed into the lock screw 34 is formed only in the portion 33, and not formed in the portion 32. Therefore, in order to increase the length of the screw hole 36, it is preferable that the thickness of the portion 33 be larger than the thickness of the portion 32. The lock section 30 adjusts the degree of the pressing force 53 by the degree of tightening the lock screw 34. In this case, the length of the screw hole 36 is increased, thereby making it possible to increase adjustment margin of the pressing force 53. However, although not shown herein, as a modification of the embodiment, the thickness of the portion 33 of the lock section 30 may be smaller than the thickness of the portion 32.

Further, the positional relationship between the slit 21 and the slit 31 shown in FIG. 6 can be expressed as follows. That is, the slit 31 is disposed closer to the side of the upper surface 112*t* than the slit 21 in the thickness direction of the nut 112. However, although not shown herein, as a modification of the embodiment, the slit 21 may be disposed closer to the side of the upper surface 112*t* than the slit 31 in the thickness direction of the nut 112.

Further, as shown in FIG. 6, a recess such as a screw hole is not formed in the portion 23. In other words, the upper surface of the portion 23 is flatter than the upper surface of the portion 24. As a modification in FIG. 6, a recess such as a screw hole, which is not shown, may be formed in a region of the portion 23, the region being in contact with the inclination adjustment screw 22. Even in the case in which a recess such as a screw hole is formed in the portion 23, if the recess does not penetrate the portion 23 in the thickness direction, it is possible to prevent the inclination adjustment screw 22 and the nut seat surface 113*t* from contacting each other. However, when a thickness of a portion of the portion 23, the portion being pressed by the inclination adjustment screw 22, becomes small, stress tends to concentrate on the portion having the small thickness. Therefore, from the viewpoint of preventing damage caused by stress concentration on the portion 23, it is preferable that a recess including a screw hole not be formed in the portion 23 as shown in FIG. 6.

Figure 10:
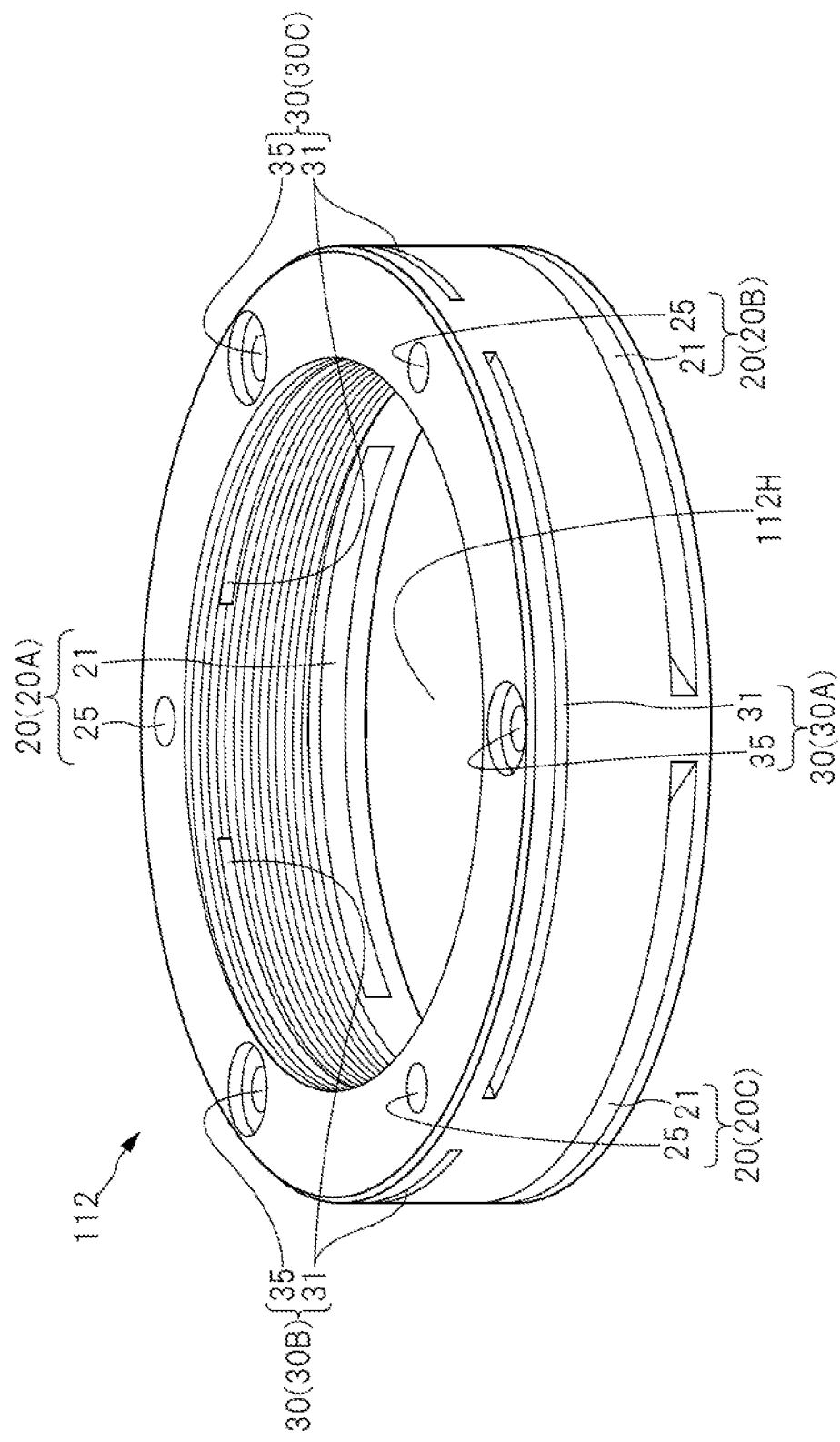
FIG. 10 is a perspective view of the nut shown in FIG. 4.

FIG. 10 is a perspective view of the nut shown in FIG. 4. As shown in FIG. 10, the nut 112 includes a plurality of inclination adjustment sections 20 spaced apart from each other. The example shown in FIG. 10 is an example of threefold symmetry, and the plurality of inclination adjustment sections 20 include inclination adjustment sections 20A, 20B, and 20C. Each of the inclination adjustment sections 20A, 20B, and 20C includes the slit 21, the inclination adjustment screw 22, the portions 23 and 24, and the screw hole 25 described with reference to FIGS. 2 to 7 and FIG. 9. When one nut 112 includes the plurality of inclination adjustment sections 20, it is possible to improve the adjustment accuracy in the inclination direction compared with the case in which only one inclination adjustment section 20 is provided. Further, when three inclination adjustment sections 20 are provided as shown in FIG. 10, the three inclination adjustment sections 20 are disposed in a well-balanced manner in a plan view, thereby making it possible to finely adjust the inclination angle. However, although not shown herein, as a modification of the embodiment, the number of inclination adjustment sections 20 provided in one nut 112 may be one or two, or may be four or more.

Additionally, the nut 112 also includes a plurality of lock sections 30 spaced apart from each other. The example shown in FIG. 10 is an example of threefold symmetry, and the plurality of lock sections 30 include lock sections 30A, 30B, and 30C. Each of the lock sections 30A, 30B, and 30C includes the slit 31, the portions 32 and 33, the lock screw 34, the through hole 35, and the screw hole 36 described with reference to FIGS. 2 to 7 and FIG. 9. When one nut 112 includes the plurality of lock sections 30, it is possible to improve the screwing strength between the nut 112 and the bolt 116 (refer to FIG. 6) compared with the case in which only one lock section 30 is provided.

Further, when three lock sections 30 are provided as shown in FIG. 10, the three lock sections 30 are disposed in a well-balanced manner in a plan view, thereby making it possible to apply the pressing force 53 shown in FIG. 6 in a well-balanced manner. However, although not shown herein, as a modification of the embodiment, the number of lock sections 30 provided in one nut 112 may be one or two, or may be four or more. Further, as shown in FIG. 10, the number of inclination adjustment sections 20 and the number of lock sections 30 are the same. In order to dispose the inclination adjustment screw 22 without interfering with the lock section, it is preferable that the number of inclination adjustment sections 20 and the number of lock sections 30 be the same. However, as a modification, the number of inclination adjustment sections 20 and the number of lock sections 30 may be different.

As shown in FIG. 10, the slit 31 of the lock section 30A and the slits 21 of some of the plurality of inclination adjustment sections 20 (the inclination adjustment sections 20B and 20C) partially overlap each other in the thickness direction of the nut 112. Further, the slit 31 of the lock section 30B and the slits 21 of some of the plurality of inclination adjustment sections 20 (the inclination adjustment sections 20A and 20C) partially overlap each other in the thickness direction of the nut 112. Further, the slit 31 of the lock section 30C and the slits 21 of some of the plurality of inclination adjustment sections 20 (the inclination adjustment sections 20A and 20B) partially overlap each other in the thickness direction of the nut 112.

As described with reference to FIGS. 6, 7, and 9, in order to allow the portion 24 of the inclination adjustment section 20 (refer to FIG. 7) to increase the amount of deformation thereof within the elastic deformation range, that is, the inclination angle thereof, the range in which the slit 21 is disposed is preferably wide. When a plurality of inclination adjustment sections 20 are provided as in the case of the nut 112 shown in FIG. 10, the slit 31 of the lock section 30A preferably has a size large enough to overlap the slits 21 of the inclination adjustment sections 20B and 20C.

Further, in the example shown in FIG. 10, the screw hole 36 of the lock section 30A (refer to FIG. 6) and each of the slits 21 of the plurality of inclination adjustment sections 20 do not overlap each other in the thickness direction of the nut 112. In FIG. 10, although the screw hole 36 shown in FIG. 6 is disposed in an invisible position, as shown in FIG. 6, the screw hole 36 is disposed directly below the through hole 35. Accordingly, it is clear that the screw hole 36 of the lock section 30A in the thickness direction of the nut 112 does not overlap each of the slits 21 of the plurality of inclination adjustment sections 20. Similarly, the screw hole 36 of the lock section 30B shown in FIG. 10 (refer to FIG. 6) and each of the slits 21 of the plurality of inclination adjustment sections 20 do not overlap each other in the thickness direction of the nut 112. Further, the screw hole 36 of the lock section 30C (refer to FIG. 6) and each of the slits 21 of the plurality of inclination adjustment sections 20 do not overlap each other in the thickness direction of the nut 112. From the viewpoint of reducing the mutual influence between the lock section 30 and the inclination adjustment section 20, it is preferable that the screw holes 36 of the lock sections 30A, 30B, and 30C do not overlap the slit 21. However, although not shown herein, as a modification of the embodiment, the screw holes 36 of the lock section 30A, 30B, or 30C may overlap the slit 21.

Further, as shown in FIG. 10, in a plan view, the inclination adjustment section 20A and the lock section 30A are disposed at respective positions facing each other via the nut hole 112H into which the bolt 116 (refer to FIG. 6) is screwed. Similarly, the inclination adjustment section 20B and the lock section 30B are disposed at respective positions facing each other via the nut hole 112H into which the bolt 116 is screwed. The inclination adjustment section 20C and the lock section 30C are disposed at respective positions facing each other via the nut hole 112H into which the bolt 116 is screwed. By disposing the respective sections as described above, it is possible to dispose a plurality of inclination adjustment sections 20 and a plurality of lock sections 30 in a well-balanced manner. Accordingly, it is possible to prevent the mutual interference between the plurality of inclination adjustment sections 20 and the plurality of lock sections 30. Thus, the embodiment has an advantage of avoiding mutual functional interference while optimizing a locking function and a gradient function.

Additionally, the slit 21 of the inclination adjustment section 20A partially overlaps the slits 31 of the lock sections 30B and 30C of the plurality of lock sections 30 in the thickness direction of the nut 112. The slit 21 of the inclination adjustment section 20B partially overlaps the slits 31 of the lock sections 30A and 30C of the plurality of lock sections 30 in the thickness direction of the nut 112. The slit 21 of the inclination adjustment section 20C partially overlaps the slits 31 of the lock sections 30A and 30B of the plurality of lock sections 30 in the thickness direction of the nut 112.

As described with reference to FIGS. 6, 7, and 9, in order to allow the portion 24 of the inclination adjustment section 20 (refer to FIG. 7) to be easily elastically deformed, the range in which the slit 21 is disposed is preferably wide. Further, the lock section 30 elastically deforms the portion 33 mainly by tightening the lock screw 34 in order to reduce a separation distance between the portions 32 and 33 (that is, a gap of the slit 31), thereby improving the screwing strength between the nut 112 and the bolt 116. Therefore, in order to allow the portions 32 and 33 to be easily elastically deformed, it is preferable that the range in which the slit 31 is disposed be wide. When a plurality of lock sections 30 and a plurality of inclination adjustment sections 20 are provided as in the case of the nut 112 shown in FIG. 10, it is preferable that each of the slits 21 of the plurality of inclination adjustment sections 20 have a sufficient size such that the same partially overlaps a part of the slits 31 of the plurality of lock sections 30 in the thickness direction of the nut 112.

Furthermore, in the case of the nut 112 shown in FIG. 10, each of the screw holes 25 of the plurality of the inclination adjustment sections 20 does not overlap each of the slits 31 of the plurality of lock sections 30 in the thickness direction of the nut 112. As a modification of the nut 112, the screw hole 25 may overlap the slit 31. In this case, depending on the length of the inclination adjustment screw 22 (refer to FIG. 6), the inclination adjustment screw 22 may straddle the slit 31 and may connect the portion 32 (refer to FIG. 6) to the portion 33 (refer to FIG. 6). More specifically, when the length of the inclination adjustment screw 22 is s long, the inclination adjustment screw 22 may connect the portion 32 to the portion 33. When the lock screw 34 shown in FIG. 6 is tightened in the state in which the portions 32 and 33 are connected to each other, the periphery of a portion connected by the inclination adjustment screw 22 is in the state of being difficult to be elastically deformed. In the case of the nut 112 shown in FIG. 10, each of the screw holes 25 of the plurality of inclination adjustment sections 20 is configured so that the same does not overlap each of the slits 31 of the plurality of lock sections 30 in the thickness direction of the nut 112, thereby making it possible to prevent the function of the lock section 30 from being inhibited by the inclination adjustment screw 22.

In addition, each of the lock section 30 and the inclination adjustment section 20 shown in FIG. 6 is intended to perform a function thereof by tightening a screw into a screw hole. However, since the lock section 30 and the inclination adjustment section 20 respectively have different uses, the required component sizes are different depending on the uses thereof. For example, in the case of the lock section 30, since the gap of the slit 21 on the periphery of the lock screw 34 may be reduced by tightening the lock screw 34, the diameter of the screw hole 36 (a distance between apexes of the screw thread of the screw hole 36) may be small. On the other hand, in the case of the inclination adjustment section 20, since the tip surface of the inclination adjustment screw 22 presses the portion 23, the thickness of the inclination adjustment screw 22 may be preferably large. Therefore, the diameter of the screw hole 25 into which the inclination adjustment screw 22 is screwed (a distance between apexes of the screw thread of the screw hole 25) is preferably large. In consideration of the above-described points, as shown in FIG. 6, the diameter of the screw hole 25 is preferably larger than the diameter of the screw hole 36.

Further, in the example shown in FIG. 4, a spot facing part 37 having a larger diameter than that of the through hole 35 is formed on the upper surface of the portion 32 of the lock section 30 (the upper surface 112t of the nut 112). The spot facing part 37 is provided in this manner, thereby making it possible to accommodate the head part of the lock screw 34 (a portion of the lock screw 34 having a larger diameter) in the spot facing part 37, as shown in FIG. 6. In the case of the example shown in FIG. 6, the head part of the lock screw 34 is configured so as not to protrude from the upper surface 112t of the nut 112. In the case of the structure shown in FIG. 6, for example, when the height of the upper surface 112t of the nut 112 is measured as a reference surface, it is possible to prevent the head part of the lock screw 34 from interfering with the height measurement.

Additionally, the nut 112 described with reference to FIGS. 1 to 7, 9, and 10 can also be used as a particularly public lock nut based on the application of holding a charged particle source used in a charged particle beam system. In this case, the configuration of the nut 112 as a lock nut will be briefly described below with reference to FIG. 6.

The nut 112 includes the upper surface 112t, the lower surface 112b on the opposite side of the upper surface 112t, the nut hole 112H (refer to FIG. 4) configured to be penetrated from one side of the upper surface 112t and the lower surface 112b to the other side thereof, the inner surface 112s2 which is the outer edge of the nut hole 112H, the outer surface 112s1 on the opposite side of the inner surface 112s2, the screw thread section 50 (refer to FIG. 4) provided on a portion of the inner surface 112s2 and formed with a plurality of screw threads 51, the inclination adjustment section 20 configured to be able to adjust the inclination angle of the nut hole 112H (refer to FIG. 4) with respect to the nut seat surface 113t facing the lower surface 112b, and the lock section 30 configured to prevent loosening of the screwed state of the bolt screwed into the nut hole 112H (refer to FIG. 4). The inner surface 112s2 includes the screw thread section 50 and the non-screw thread section 40 (refer to FIG. 4) having an inner diameter larger than that of the screw thread section 50. The inclination adjustment section 20 includes the slit 21 formed to be penetrated from a portion of the outer surface 112s1 to a portion of the non-screw thread section 40, the inclination adjustment screw 22, the portion 23 located between the slit 21 and the lower surface 112b, the portion 24 located between the slit 21 and the upper surface 112t, and the screw hole 25 into which the inclination adjustment screw 22 is screwed, the screw hole 25 being formed to be penetrated from the upper surface 112t to the slit 21 in the portion 24. In the nut 112 as a lock nut, when the tip of the inclination adjustment screw 22 presses the nut seat surface 113t via the portion 23, the inclination angle of the charged particle source 111 with respect to the nut seat surface 113t is changed.

Further, the nut 112 shown in FIGS. 2 to 7, 9, and 10 also includes both the inclination adjustment section 20 and the lock section 30. However, as a modification, there is a nut including any one of the inclination adjustment section 20 and the lock section 30. For example, in the case of a nut having only the lock section 30 without the inclination adjustment section 20, the inclination angle cannot be adjusted in the state in which the nut adheres to the nut seat 113 shown in FIG. 6. However, by providing the lock section 30, it is possible to prevent loosening of the screw thread section between the bolt 116 and the nut even when vibration and impact are applied to the charged particle gun 110.

As described above, representative modifications of the embodiments have been described, but the present invention is not limited to the above-described embodiments and representative modifications. Various modifications can be applied without departing from the gist of the invention.

INDUSTRIAL APPLICABILITY

The present invention is applicable to a charged particle gun, a charged particle beam system, and a lock nut.

REFERENCE SIGNS LIST 20, 20A, 20B, 20C: inclination adjustment section
21: slit (sloped slit)
22: inclination adjustment screw
22D, 34D: arrow
23, 24, 32, 33: portion
25: screw hole (sloped screw hole)
26: force (inclination force)
30, 30A, 30B, 30C: lock section
31: slit (lock slit)
34: lock screw
35: through hole
36: screw hole (lock screw hole)
37: spot facing part
40: non-screw thread section
50: screw thread section
51: screw thread (male screw thread)
52: screw thread (female screw thread)
53: pressing force (locking force)
100: scanning electron microscope (charged particle beam system)
101: charged particle beam
102: secondary electron
110: charged particle gun
111: charged particle source
112, 112N: nut
112b: lower surface (nut lower surface)
112c: nut axis
112H: nut hole
112s1: outer surface (nut outer surface)
112s2: inner surface (nut outer surface)
112t: upper surface (nut outer surface)
113: nut seat
113t: nut seat surface
114: adjustment ring base
116: bolt
117: nut position adjustment screw
120: optical processing unit
121: focusing lens
122: deflector
123: objective lens
124: secondary electron detector (detection unit)
130: sample holding unit
131: sample
140: computer system 141: computer
142: image processing unit
143: display device
144: input unit
150: exhaust pump

The invention claimed is:

1. A charged particle gun comprising:
a charged particle source;
a bolt having the charged particle source attached thereto;
a nut including a first surface and a second surface on an opposite side of the first surface and configured to hold the charged particle source by being screwed onto the bolt having the charged particle source attached thereto; and
a nut seat surface configured to contact the second surface of the nut,
wherein the nut includes:
the first surface, the second surface, an outer surface, and an inner surface;
a screw thread section provided on a portion of the inner surface and formed with a plurality of screw threads to be screwed with the bolt;
an inclination adjustment section configured to be able to adjust an inclination angle of the charged particle source with respect to the nut seat surface, the charged particle source being in a state of being held by the nut; and
a lock section configured to prevent loosening of a screwed state between the nut and the bolt, wherein:
the inner surface of the nut includes:
the screw thread section; and
a non-screw thread section having an inner diameter larger than an inner diameter of the screw thread section, and
the inclination adjustment section includes:
a first slit formed to be penetrated from a portion of the outer surface to a portion of the non-screw thread section;
an inclination adjustment screw;
a first portion positioned between the first slit and the second surface;
a second portion positioned between the first slit and the first surface; and
a first screw hole having the inclination adjustment screw screwed thereinto, the first screw hole being formed to be penetrated from the first surface to the first slit in the second portion,
wherein a tip of the inclination adjustment screw expands the first slit and presses the nut seat surface via the first portion, thereby changing the inclination angle of the charged particle source with respect to the nut seat surface.

2. The charged particle gun according to claim 1, wherein the lock section includes:
a second slit formed to be penetrated from a portion of the outer surface to a portion of the screw thread section;
a third portion positioned between the second slit and the first surface;
a fourth portion positioned between the second slit and the second surface;
a lock screw;
a first through hole having the lock screw inserted thereinto, the first through hole being formed to be penetrated from a side of the first surface to the second slit in the third portion; and
a second screw hole having the lock screw screwed thereinto, the second screw hole being formed from a side of the second slit toward the second surface in the fourth portion,
wherein the lock screw is tightened to reduce a gap of the second slit, thereby allowing a sloped surface of a female screw thread of each of the third portion and the fourth portion to press a sloped surface of a male screw thread of the bolt.

3. The charged particle gun according to claim 1, wherein a screw hole is not formed in the first portion of the inclination adjustment section.

4. The charged particle gun according to claim 2, wherein the lock section and the inclination adjustment section do not overlap each other in a plan view.

5. The charged particle gun according to claim 4, wherein a thickness of the second portion of the inclination adjustment section is larger than a thickness of the first portion.

6. The charged particle gun according to claim 5, wherein a thickness of the fourth portion of the lock section is larger than a thickness of the third portion.

7. The charged particle gun according to claim 4, wherein the second slit is disposed closer to the side of the first surface than the first slit.

8. The charged particle gun according to claim 2, wherein the nut includes a plurality of the inclination adjustment sections spaced apart from each other,
wherein the second slit of the lock section and the first slits of some of the plurality of inclination adjustment sections partially overlap each other in a thickness direction of the nut.

9. The charged particle gun according to claim 8, wherein the second screw hole of the lock section and the respective first slits of the plurality of inclination adjustment sections do not overlap each other in the thickness direction of the nut.

10. The charged particle gun according to claim 2, wherein the nut includes:
the plurality of inclination adjustment sections spaced apart from each other; and
the plurality of lock sections spaced apart from each other.

11. The charged particle gun according to claim 10, wherein, in a plan view, the inclination adjustment section and the lock section are disposed at positions facing each other via a nut hole having the bolt screwed thereinto.

12. The charged particle gun according to claim 10, wherein the first slit of each of the plurality of inclination adjustment sections partially overlaps the second slits of some of the plurality of lock sections in a thickness direction of the nut.

13. The charged particle gun according to claim 12, wherein the first screw hole of each of the plurality of inclination adjustment sections does not overlap the second slit of each of the plurality of lock sections in the thickness direction of the nut.

14. A charged particle beam system comprising:
a charged particle gun;
an optical processing unit configured to optically process a charged particle beam emitted from the charged particle gun;
a sample holding unit configured to hold a sample to be irradiated with the charged particle beam; and
a computer system configured to control the optical processing unit, wherein the charged particle gun includes:
a charged particle source;
a bolt having the charged particle source attached thereto;
a nut including a first surface and a second surface on an opposite side of the first surface and configured to hold the charged particle source by being screwed onto the bolt having the charged particle source attached thereto; and
a nut seat surface configured to contact the second surface of the nut,
wherein the nut includes:
the first surface, the second surface, an outer surface, and an inner surface;
a screw thread section provided on a portion of the inner surface and formed with a plurality of screw threads to be screwed with the bolt;
an inclination adjustment section configured to be able to adjust an inclination angle of the charged particle source with respect to the nut seat surface, the charged particle source being in a state of being held by the nut; and
a lock section configured to prevent loosening of a screwed state between the nut and the bolt, wherein:
the inner surface of the nut includes:
the screw thread section; and
a non-screw thread section having an inner diameter larger than an inner diameter of the screw thread section, and
the inclination adjustment section includes:
a first slit formed to be penetrated from a portion of the outer surface to a portion of the non-screw thread section;
an inclination adjustment screw;
a first portion positioned between the first slit and the second surface;
a second portion positioned between the first slit and the first surface; and
a first screw hole having the inclination adjustment screw screwed thereinto, the first screw hole being formed to be penetrated from the first surface to the first slit in the second portion,
wherein a tip of the inclination adjustment screw expands the first slit and presses the nut seat surface via the first portion, thereby changing the inclination angle of the charged particle source with respect to the nut seat surface.

15. The charged particle beam system according to claim 14, wherein the lock section includes:
a second slit formed to be penetrated from a portion of the outer surface to a portion of the screw thread section;
a third portion positioned between the second slit and the first surface;
a fourth portion positioned between the second slit and the second surface;
a lock screw;
a first through hole having the lock screw inserted thereinto, the first through hole being formed to be penetrated from a side of the first surface to the second slit in the third portion; and
a second screw hole having the lock screw screwed thereinto, the second screw hole being formed from a side of the second slit toward the second surface in the fourth portion,
wherein the lock screw is tightened to reduce a gap of the second slit, thereby allowing a sloped surface of a female screw thread of each of the third portion and the fourth portion to press a sloped surface of a male screw thread of the bolt.

16. A lock nut comprising:
a first surface;
a second surface on an opposite side of the first surface;
a nut hole penetrated from one side of the first surface and the second surface to the other side thereof;
an inner surface which is an outer edge of the nut hole;
an outer surface on an opposite side of the inner surface;
a screw thread section provided on a portion of the inner surface and formed with a plurality of screw threads;
an inclination adjustment section configured to be able to adjust an inclination angle of the nut hole with respect to a nut seat surface facing the second surface; and
a lock section configured to prevent loosening of a screwed state of a bolt screwed into the nut hole, wherein:
the inner surface includes:
the screw thread section; and
a non-screw thread section having an inner diameter larger than an inner diameter of the screw thread section, and
the inclination adjustment section includes:
a first slit formed to be penetrated from a portion of the outer surface to a portion of the non-screw thread section;
an inclination adjustment screw;
a first portion positioned between the first slit and the second surface;
a second portion positioned between the first slit and the first surface; and
a first screw hole having the inclination adjustment screw screwed thereinto, the first screw hole being formed to be penetrated from the first surface to the first slit in the second portion,
wherein a tip of the inclination adjustment screw presses the nut seat surface via the first portion, thereby changing an inclination angle of a nut axis with respect to the nut seat surface.

17. The lock nut according to claim 16, wherein the lock section includes:
a second slit formed to be penetrated from a portion of the outer surface to a portion of the screw thread section;
a third portion positioned between the second slit and the first surface;
a fourth portion positioned between the second slit and the second surface;
a lock screw;
a first through hole having the lock screw inserted thereinto, the first through hole being formed to be penetrated from a side of the first surface to the second slit in the third portion; and
a second screw hole having the lock screw screwed thereinto, the second screw hole being formed from a side of the second slit toward the second surface in the fourth portion,
wherein the lock screw is tightened to reduce a gap of the second slit, thereby allowing a sloped surface of a female screw thread of each of the third portion and the fourth portion to press a sloped surface of a male screw thread of the bolt.

* * * * *